United States Patent [19]
Hunt et al.

[11] Patent Number: 5,099,294
[45] Date of Patent: Mar. 24, 1992

[54] EDGE GEOMETRY SUPERCONDUCTING TUNNEL JUNCTIONS UTILIZING AN NBN/MGO/NBN THIN FILM STRUCTURE

[75] Inventors: Brian D. Hunt; Henry G. LeDuc, both of Pasadena, Calif.

[73] Assignee: The United States of America as represented by the Administrator of the National Aeronautics and Space Administration, Washington, D.C.

[21] Appl. No.: 641,798

[22] Filed: Jan. 16, 1991

Related U.S. Application Data

[63] Continuation of Ser. No. 387,928, Aug. 1, 1989, abandoned.

[51] Int. Cl.⁵ .............. H01L 39/22; H01L 27/12; H01L 45/00; H01L 49/02
[52] U.S. Cl. ............................ 357/5; 357/4; 505/862; 505/871
[58] Field of Search .............. 357/5, 4; 437/127, 976; 505/862, 871; 307/306

[56] References Cited

U.S. PATENT DOCUMENTS 4,768,069  8/1988  Talvacchio ..................... 357/5
4,831,421  5/1989  Gallagher et al. ............... 357/5

FOREIGN PATENT DOCUMENTS 60-169175  9/1985  Japan.
61-220385  6/1986  Japan ........................... 357/5
62-072187  4/1987  Japan.

Primary Examiner—Andrew J. James
Assistant Examiner—Stephen D. Meier
Attorney, Agent, or Firm—Thomas H. Jones; John R. Manning

[57] ABSTRACT

An edge defined geometry is used to produce very small area tunnel junctions (30) in a structure with niobium nitride superconducting electrodes (14, 28) and a magnesium oxide tunnel barrier (24). The incorporation of an MgO tunnel barrier with two NbN electrodes results in improved current-voltage characteristics, and may lead to better junction noise characteristics. The NbN electrodes are preferably sputter-deposited, with the first NbN electrode deposited on an insulating substrate maintained at about 250° to 500° C. for improved quality of the electrode.

19 Claims, 2 Drawing Sheets

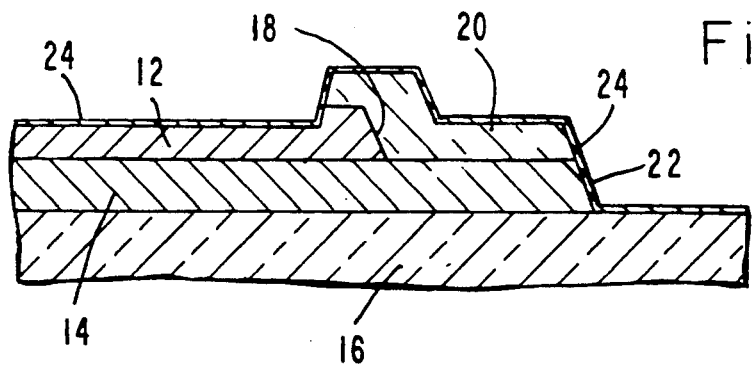
Fig. 2c.
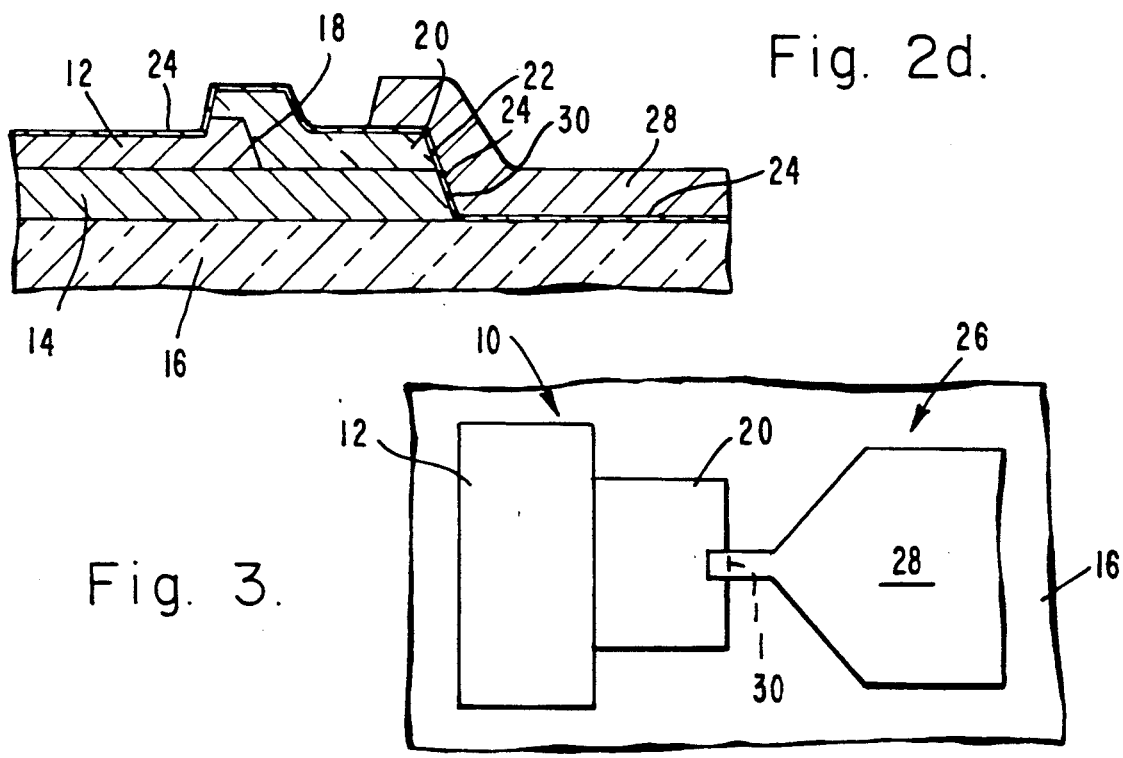
Fig. 2d.
Fig. 3.
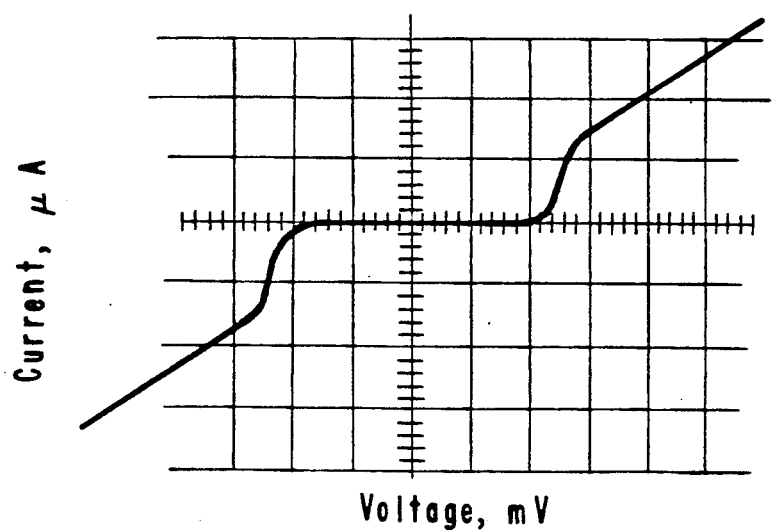
Fig. 4.

EDGE GEOMETRY SUPERCONDUCTING TUNNEL JUNCTIONS UTILIZING AN NBN/MGO/NBN THIN FILM STRUCTURE

ORIGIN OF THE INVENTION

The invention described herein was made in the performance of work under a NASA contract, and is subject to the provisions of Public Law 96-517 (35 U.S.C. 202) in which the Contractor has elected not to retain title.

This is a continuation of application Ser. No. 07/387,928 field on Aug. 1, 1989, now abandoned.

TECHNICAL FIELD

The invention relates to superconductive devices, and, more particularly, to such devices utilizing superconductor-insulator-superconductor tunnel junctions.

BACKGROUND ART

Since their first use as quasiparticle mixers, SIS (superconductor-insulator-superconductor) tunnel junctions have become the lowest noise broad band mixers from 30 GHz to 760 GHz. Sensitivity of these mixers has approached the quantum limit (hν power per unit bandwidth) at frequencies up to 110 GHz. A comprehensive theory of these devices has been developed which predicts excellent performance for SIS tunnel junctions as mixers well below millimeter wavelengths. However, actual development of submillimeter SIS mixers has been limited by currently used lead alloy junctions. Lead alloy junctions give excellent mixer results in the near-millimeter wave region, but have poor chemical, thermal, and electrical stability because lead is a soft, low melting point material.

For high speed switching or high frequency detection applications utilizing SIS tunnel junctions, devices with very thin tunnel barriers and correspondingly high current densities ($J_c$) are required. This constraint arises from the fact that the junction resistance decreases exponentially with decreasing barrier thickness, while the capacitance only increases linearly as the barrier thickness is reduced. Thus, the maximum operating frequency, which is inversely proportional to the resistance-capacitance (RC) product, can be increased by reducing the tunnel barrier thickness. Practical applications also require that the junction resistance be large enough (typically > 50Ω) to allow impedance matching to external circuits. Because the RC product is independent of area while the resistance increases as the junction area is decreased, this requirement can be met by fabricating small cross-sectional area tunnel junctions. To obtain junctions with adequate resistances and frequency response above 200 to 300 GHz, it is necessary to produce junctions with areas less than approximately 1.0 $\mu m^2$, which are difficult to achieve using conventional photolithography.

One useful technique for fabrication of small area tunnel junctions utilizes an edge geometry to achieve very small junction areas without resorting to high resolution lithography. Superconducting edge junctions have been fabricated in a variety of materials systems, including Pb/Sn, PbIn/Pb, Nb/Pb-alloys, and NbN/Pb. However, relatively little work exists on all-refractory edge junctions, with only brief reports on Nb/Nb$_2$O$_5$/Nb and NbN/Si/NbN junctions.

A recent patent by J. J. Talvaccio et al (U.S. Pat. No. 4,768,069) discloses a planar geometry of NbN/MgO-CaO/NbN. The substrate is heated to about 700° C. to sputter-deposit the first NbN electrode and the oxide barrier layer.

For most practical high frequency applications, it is also necessary to fabricate superconducting tunnel junctions with high quality current-voltage (I-V) characteristics. In this case "high quality" means low subgap leakage coupled with a current rise at the gap sum which is narrow on the scale of the operating frequency. It is also highly desirable to utilize junction materials which are resistant to chemical attack and static discharges. In summary, then, high frequency applications require rugged, small area tunnel junctions with high current density, high quality I-V characteristics. Such characteristics are not achieved with the prior art teachings.

STATEMENT OF THE INVENTION

Accordingly, it is an object of the invention to provide a superconducting device with a very small junction area.

It is another object of the invention to provide an edge-geometry superconducting tunnel junction device utilizing NbN electrodes and an MgO tunnel barrier.

It is still another object of the invention to provide a process for fabricating an edge-geometry superconducting tunnel junction device utilizing NbN electrodes and an MgO tunnel barrier.

In accordance with the invention, edge-geometry NbN/MgO/NbN superconducting tunnel junctions are provided. The use of an edge-geometry allows very small junction areas to be obtained, while the all-NbN electrodes permit operation at 8 to 10K, with a potential maximum operating frequency above 1 THz.

Also in accordance with the invention, a novel technique for producing very small area tunnel junctions with conventional photolithography uses an edge geometry to define the junction area. Edge geometry tunnel junction fabrication relies on the formation of a tunnel barrier on the exposed edge of a superconducting film. The junction is completed by deposition and patterning of a superconducting counterelectrode. Because the top surface of the base superconductor is covered by a thick insulator, the contact area between the counterelectrode and the base electrode is determined by the thickness of the base layer and the width of the top electrode tip. Because the base electrode thickness can easily be in the 0.1 $\mu m$ range, junction areas on the order of 0.1 $\mu m^2$ are readily attainable using conventional photolithography at the 1 $\mu m$ resolution level. A somewhat more subtle advantage of the edge geometry is that the in-line structure minimizes current-crowding effects that can lead to electrode transitions in high-current-density, planar-geometry junctions.

This is believed to be the first successful fabrication of edge-geometry tunnel junctions utilizing two niobium nitride electrodes with a magnesium oxide tunnel barrier. The combination of an all-NbN electrode structure with an MgO barrier results in very rugged tunnel junctions with very high quality I-V characteristics and junction areas as small as 0.1 $\mu m^2$. In addition, the process described below has produced NbN/MgO/NbN edge junctions with current densities up to $1.5 \times 10^4$ A/cm$^2$, which is sufficient for junction operation at frequencies in the 500 GHz range. These devices have demonstrated excellent performance in preliminary receiver tests at 205 GHz, yielding receiver noise temperatures as low as 380° K.

BRIEF DESCRIPTION OF THE DRAWINGS

FIGS. 2a-d are cross-sectional views depicting the edge junction process of the invention at various stages;

FIG. 3 is a schematic top plan view of the thin film structure; and

FIG. 4 is a plot, on coordinates of current and voltage, depicting the I-V characteristics of a $0.1 \times 1$ $\mu m^2$ NbN/MgO/NbN edge junction, with the vertical scale in 10 $\mu A$/division and the horizontal scale in 2 mV/division.

DETAILED DESCRIPTION OF THE INVENTION

The word "edge" as used herein is intended to refer to that smaller area side surface between two larger area plane surfaces. The plane surfaces are defined by the upper and lower surfaces of the NbN electrodes which sandwich the MgO film.

Figure 1:
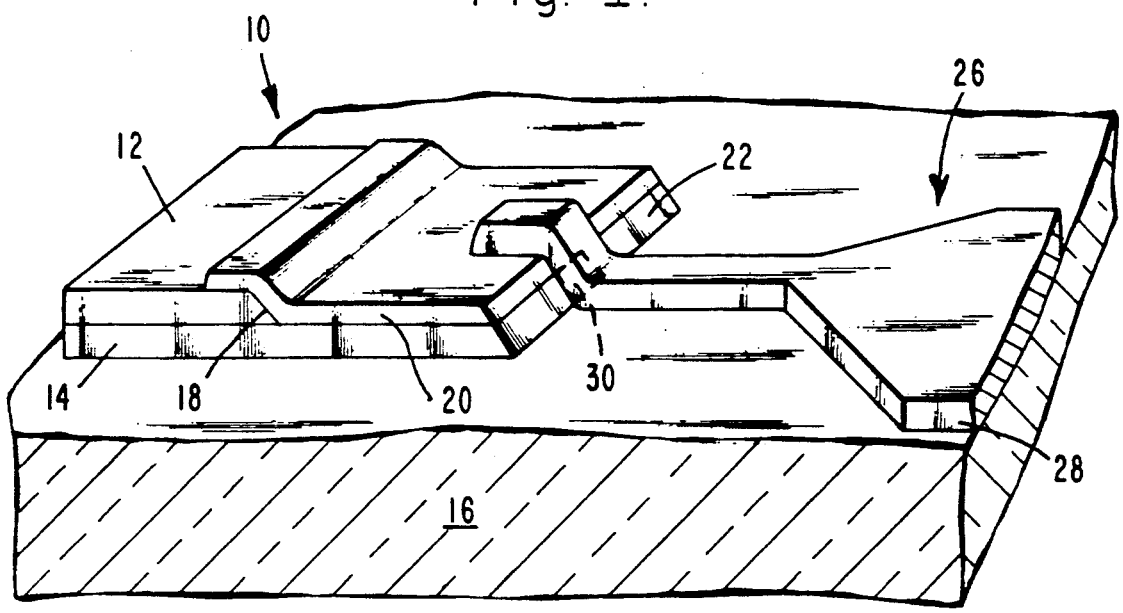
FIG. 1 is a perspective view of an edge-geometry superconducting tunnel junction utilizing an NbN/MgO/NbN thin film structure in accordance with the invention.

The NbN/MgO/NbN thin film structure is depicted in FIG. 1. The edge-geometry tunnel junction comprises a base electrode contact 10 of a patterned aluminum metal layer 12 formed on a NbN layer 14, formed on an insulating substrate 16. The aluminum layer 12 is patterned to provide an edge 18. A layer 20 of Al$_2$O$_3$ is then formed and patterned to overlap the edge 18 of the aluminum layer 12. The patterned Al$_2$O$_3$ is used to define an edge 22 in the NbN layer 14. A very thin layer of MgO 24 is then deposited on the edge 22. Next, a counterelectrode contact 26 comprising a layer 28 of NbN is formed on the substrate, overlapping the MgO-coated edge 22 of the first NbN layer 14. The portion of the counter-electrode overlapping the edge 22 is patterned to provide a small area contact 30 with the MgO-coated edge of NbN.

The basic NbN/MgO/NbN edge junction process is described below. The key fabrication steps are shown in FIGS. 2a-d. While specific parameters are given, it should be understood that these are exemplary only, and that other process parameters which provide the described result are within the scope of the invention.

Figure 2A:
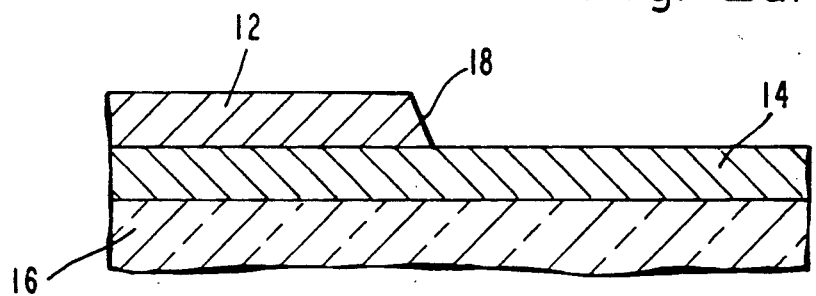

The initial process in edge junction fabrication is D.C. magnetron sputter deposition of the base NbN layer 14 ($\approx 0.1$ $\mu m$) and an Al overlayer 12, typically on a sapphire substrate 16 (FIG. 2a). The substrate 16 conveniently comprises 0.625 inch square, 0.010 inch thick, unoriented sapphire substrates, although other insulating substrates, such as silica (e.g., SiO$_2$ on Si, or quartz) and magnesia, may be used. In the case of silica, a buffer layer MgO of about 200 to 500 Å thick, helps the growth of the NbN electrode. Such a buffer layer is formed by sputter deposition of MgO in an Ar-N, atmosphere.

NbN is reactive-DC sputtered from a Nb target in an Ar—N$_2$ mixture using a 2 inch diameter planar magnetron sputter gun. Ar flow rates are 20 to 150 sccm, and Ar partial pressures are 13.5 mTorr. N$_2$ flow rates are typically 2 to 15 sccm. Sputtering currents are held fixed at 0.50 Amps, and the target to substrate distance is 2.75 inches. The NbN layer 14 is formed to a thickness of about 100 to 10,000 Å, and preferably from about 0.1 to 0.2 $\mu m$.

During the NbN deposition, the insulating substrate 16 is preferably heated to about 250° to 500° C., and more preferably from about 300° to 450° C. The heating is believed to promote the formation of high quality NbN near the substrate surface, which is essential for obtaining edge junctions with low subgap leakage and sharp gap edges. Such heating tends to result in a more uniform composition through the thickness of the NbN layer. However, moderate quality junction fabrication is also possible on unheated substrates.

The substrate 16 must be heated to about 300° C. in order to obtain the desired substantially uniform composition throughout the thickness of the NbN layer. Heating to more than about 500° C. produces poor quality edge junctions, due to substrate interactions with the NbN layer.

The Al layer 12 is next formed, using an Al target and an Ar flow rate and partial pressure as above. The Al layer 12 is formed to a thickness of about 0.6 $\mu m$, which is appropriate for a base NbN layer of about 1,000 to 1,500 Å.

It will be noted that the aluminum layer thickness is chosen so that at least a small amount of Al remains after the ion milling process. Thus, the thickness of this layer is determined by the thickness of the base NbN layer which sets the required milling time. Any other metal layer or combination of metal layers can be used instead of aluminum, provided that these layers can be selectively etched relative to the base NbN layer, and provided that such layers survive the ion milling process and are chemically compatible with NbN.

One such alternate process which has been implemented by the inventors utilizes a metal bilayer of a thin Al film ($\approx 100$ to 250 Å) deposited on the base NbN layer and overlaid by a second NbN layer with a thickness typically 500 to 1,000 Å greater than the base NbN layer. In this case, the top NbN layer is photolithographically patterned using the conventional CF$_4$/0$_2$ RIE (reactive ion etch) dry etch down to the thin Al film, which serves as an etch stop. The Al layer is then wet-etched and the process proceeds as normal. This modification to the conventional process minimizes the chemical interaction between Al and NbN which can sometimes occur.

Following the metal depositions, the Al layer 12 is patterned using photolithography and wet etching. The aluminum layer ultimately serves as the edge junction base electrode contact 10. An edge 18 is defined at one end of the patterned aluminum layer 12.

A layer 20 of Al$_2$O$_3$ is then deposited everywhere, such as by electron beam evaporation, to a thickness of about 0.1 to 0.8 $\mu m$ (as determined by the base NbN thickness). The Al$_2$O$_3$ thickness is determined by the requirement that an insulating layer remain on top of the base NbN layer after the ion-milling edge-cutting process is complete. Al$_2$O$_3$ is typically used because it has a low ion milling rate, but any other insulator could be used, provided that it could be patterned appropriately by lift-off or etching in a thick enough layer to serve as an ion milling mask. Bilayers of insulators could also be used with the same restrictions. Junctions have been fabricated using bilayers of SiO$_2$ over Al$_2$O$_3$, as well as with single layers of SiO$_2$.

Figure 2B:
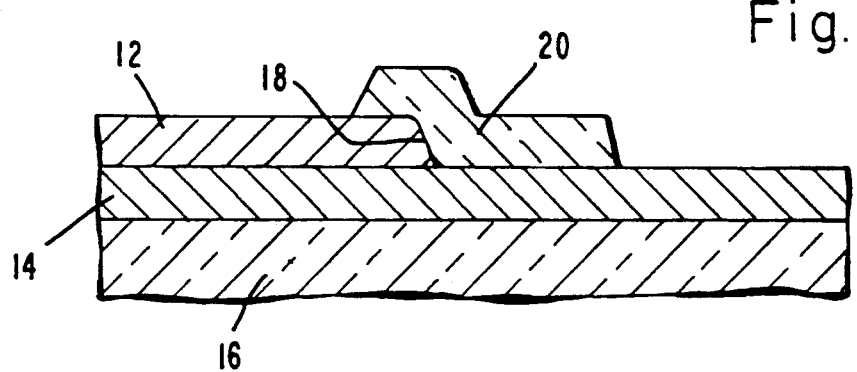

The Al$_2$O$_3$ layer 20 is patterned via liftoff to provide a milling mask, as shown in FIG. 2b.

The patterned Al$_2$O$_3$ and Al layers 20, 12 shown in FIG. 2b serve as ion milling masks to protect the underlying NbN layer 14 during the edge-cutting step. A 500 eV Ar ion beam is used to define the NbN edge 22, shown in FIG. 2c. The resulting edge in inherently sloped at about 60° from the horizontal plane (about 30° off normal). Immediately following the edge milling, a lower energy (80 to 150 eV) Ar ion beam cleaning step is done to remove any surface damage caused by the high energy edge definition process. The use of low energy ions minimizes the thickness of the damaged surface layer, which is especially important for a short coherence length material like NbN.

After the edge cleaning, the MgO tunnel barrier 24 and NbN counterelectrode layer 28 are deposited, using RF magnetron sputtering for the MgO and DC magnetron sputtering for NbN.

MgO is RF sputtered from pressed MgO targets using a 2 inch diameter planar magnetron sputter gun. Ar flow rates are 20 to 150 sccm, and the Ar pressure is 10.0 mTorr. MgO is deposited intermittently by rotating the substrate over the sputter gun; this provides better thickness control and helps promote uniformity in the typically 1 nm thick MgO barrier 24. Following the MgO deposition, the barrier is exposed to a brief oxygen plasma discharge.

The MgO barrier film is blanket-deposited to a thickness of about 5 to 30 Å and, more preferably, to a thickness of about 5 to 20 Å. At least about 5 Å (about one monolayer) is required for high quality tunneling barriers, while thicknesses greater than about 30 Å defeat tunneling.

The NbN counter-electrode layer 28 is formed, using the same process as above for the deposition of NbN layer 14, except that the substrate is not intentionally heated. The NbN counter-electrode was also coated with an evaporated 300 Å gold layer (not shown) to aid in making contact to the junctions.

Finally, the counterelectrode is patterned using standard photolithography and reactive ion etching in a CF$_4$/O$_2$ gas mixture (FIG. 2c and 3).

Using the above process, edge junctions with areas ranging from 0.1 to 0.8 $\mu$m$^2$ have been fabricated. These are the first reported NbN/MgO/NbN edge junctions. The areas of the edge junctions may range from about 0.01 to 1 $\mu$m$^2$.

FIG. 4 presents the current-voltage characteristics of a typical 0.1×1 $\mu$m$^2$ junction with a current density of 1×10$^4$ A/cm$^2$, a junction resistance of 325 $\Omega$, and a gap sum of 4.9 mV. For this junction, the value of $V_m(V_m=I_cR_{sg})$ is 61 mV where $R_{sg}$ is measured at 3 mV and 4.2K, and the gap spread is approximately 0.7 mV. The junction parameters obtained for these all-NbN edge junctions are superior to parameters for prior art trilayer NbN/MgO/NbN junctions of similar current density as described in U.S. Pat. No. 4,768,069. In particular, the edge junctions of the invention show lower subgap leakage than the devices of U.S. Pat. No. 4,768,069 for junctions of a given current density, as evidenced by the high values of $V_m$ (at 3 mV) obtained for the edge junctions of the invention.

The present edge junction characteristics are suitable for SIS mixer testing in the 300 to 500 GHz range.

Thus, there has been disclosed a superconducting tunnel junction device comprising a tunnel junction region comprising an MgO film sandwiched between two NbN electrodes, the MgO film being formed on a portion of an edge of one of the electrodes. It will be readily apparent to those skilled in this art that various changes and modifications of an obvious nature may be made. All such changes and modifications are considered to fall within the scope of the invention, as defined by the appended claims.

We claim:

1. A superconducting tunnel junction device comprising a tunnel junction region comprising MgO film having a thickness ranging from about 5 to 30 Å and sandwiched between two electrodes comprising NbN, each electrode bounded by upper and lower plane surfaces, said MgO film formed on a portion of a side surface of one of said NbN electrodes, said side surface comprising that smaller area surface between said two plane surfaces, each having a larger area than said side surface.

2. The device of claim 1 formed on an insulating substrate.

3. The device of claim 2 wherein said insulating substrate is selected from the group consisting of Al$_2$O$_3$, SiO$_2$, and MgO.

4. The device of claim 3 wherein said insulating substrate is selected from the group consisting of sapphire and quartz.

5. The device of claim 1 wherein said NbN electrodes each range from about 100 to 10,000 Å in thickness.

6. The device of claim 5 wherein said electrodes each range from about 1,000 to 2,000 Å in thickness.

7. The device of claim 1 wherein said MgO film ranges from about 5 to 20 Å in thickness.

8. The device of claim 1 comprising (a) a first electrode of NbN formed on an insulating substrate, said first electrode provided with a beveled side surface, (b) an insulating layer formed on said first electrode, (c) said MgO film formed on at least part of said insulating layer, on said beveled side surface, and on at least a part of said insulating layer, and (d) a second electrode of NbN formed on said MgO-covered substrate and on said beveled side surface, said second electrode of NbN patterned to provide a small area contact with said MgO-coated beveled side surface.

9. The device of claim 8 wherein said insulating layer consists essentially of Al$_2$O$_3$.

10. The device of claim 8 wherein said small area contact ranges from about 0.01 to 1 $\mu$m$^2$.

11. A superconducting tunnel junction device comprising a tunnel junction region consisting essentially of an MgO film having a thickness ranging from about 5 to 30 Å and sandwiched between two electrodes consisting essentially of NbN, each electrode bounded by upper and lower plane surfaces, said MgO film formed on a portion of a side surface of one of said NbN electrodes, said side surface comprising that smaller area surface between said two plane surfaces, each having a larger area than said side surface, said electrodes formed on an insulating substrate.

12. The device of claim 11 wherein said insulating substrate is selected from the group consisting of Al$_2$O$_3$, SiO$_2$, and MgO.

13. The device of claim 12 wherein said insulating substrate is selected form the group consisting of sapphire and quartz.

14. The device of claim 13 wherein said NbN electrodes each range from about 100 to 10,000 Å in thickness.

15. The device of claim 14 wherein said electrodes each range from about 1,000 to 2,000 Å in thickness.

16. The device of claim 11 wherein said MgO layer ranges from about 5 to 20 Å in thickness.

17. The device of claim 11 comprising (a) a first electrode of NbN formed on an insulating substrate, said first electrode provided with a beveled side surface, (b) an insulating layer formed on said first electrode, (c) said MgO film formed on at least part of said insulating layer, on said beveled side surface, and on at least a part of said insulating layer, and (d) a second electrode of NbN formed on said MgO-covered substrate and on said beveled side surface, said second electrode of NbN patterned to provide a small area contact with said MgO-coated beveled side surface.

18. The device of claim 17 wherein said insulating layer consists essentially of $Al_2O_3$.

19. The device of claim 17 wherein sad small area contact ranges from about 0.01 to 1 $\mu m^2$.